United States Patent [19]
Pascucci

[11] Patent Number: 5,742,187
[45] Date of Patent: Apr. 21, 1998

[54] DECODER WITH REDUCED ARCHITECTURE

[75] Inventor: Luigi Pascucci, Sesto San Giovanni, Italy

[73] Assignee: SGS-Thomson Microelectronics S.r.l., Agrate Brianza, Italy

[21] Appl. No.: 560,090

[22] Filed: Nov. 17, 1995

[30] Foreign Application Priority Data

Nov. 18, 1994 [EP] European Pat. Off. ............. 94830539

[51] Int. Cl.$^6$ ........................ H03K 19/084; H03K 19/20
[52] U.S. Cl. ........................ 326/106; 326/108; 326/121
[58] Field of Search .................... 326/106, 108, 326/121, 119

[56] References Cited

U.S. PATENT DOCUMENTS

| | | | |
|---|---|---|---|
| 3,439,185 | 4/1969 | Gibson | 326/121 |
| 3,539,823 | 11/1970 | Zuk | 307/215 |
| 3,851,186 | 11/1974 | Koo | 307/205 |
| 3,904,888 | 9/1975 | Griffin et al. | 326/121 |
| 4,866,305 | 9/1989 | Hasegawa | 326/106 |
| 5,309,043 | 5/1994 | Murahashi | 326/121 |

*Primary Examiner*—Edward P. Westin
*Assistant Examiner*—Richard Roseen
*Attorney, Agent, or Firm*—Wolf, Greenfield & Sacks, P.C.; James H. Morris

[57] ABSTRACT

An improved decoder with a reduced architecture that decodes a plurality of input signals that include a least significant input signal. The decoder comprises at least one pair of adjacent logic gates, each of the at least one pair of logic gates receiving at least one logic input signal that is selected from a group of logic signals that include the input signals to the decoder and the inverse of the input signals to the decoder. The logic input signals received by the at least one pair of adjacent logic gates are common to both adjacent logic gates of the pair, except for those logic signals representing the least significant decoder input signal and the inverse of the least significant decoder signal.

26 Claims, 9 Drawing Sheets

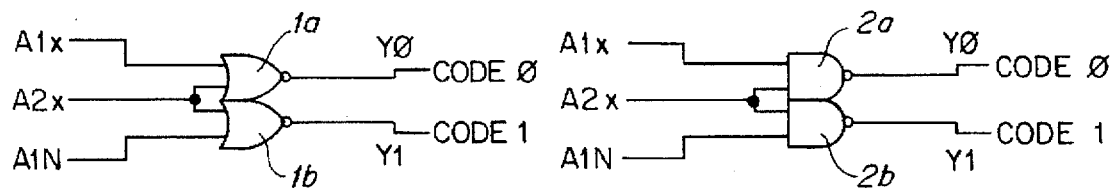
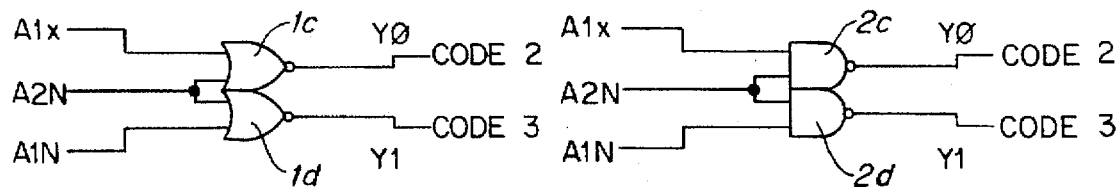
Fig. 5    Fig. 6
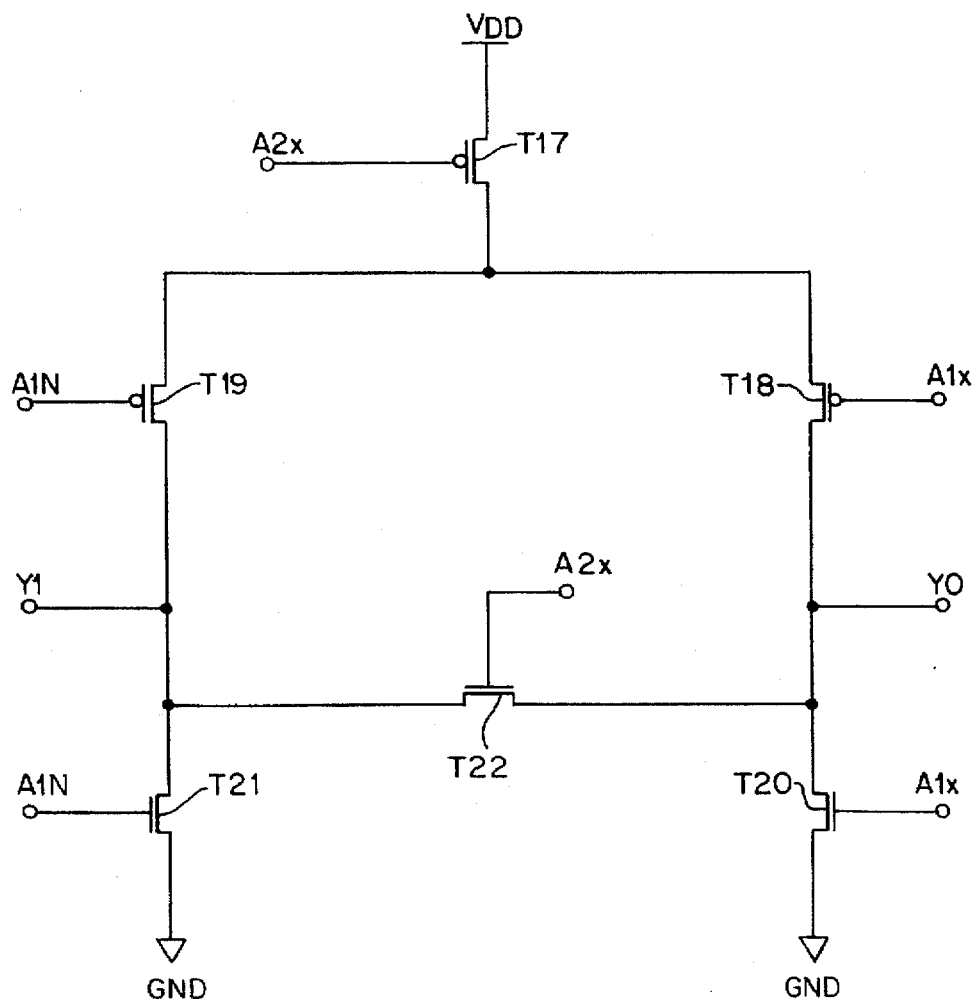
Fig. 7

DECODER WITH REDUCED ARCHITECTURE

BACKGROUND OF THE INVENTION

1. Field of the Invention

The present invention relates to a decoder with a reduced architecture, particularly for FULL CMOS circuits.

2. Discussion of the Related Art

It is known that decoders are electronic devices having multiple inputs and multiple outputs. Only one output is activated for each combination of the levels of the inputs. An example of this application is the conversion of a number in BCD code to the decimal system. Such decoder circuits are generally provided, in integrated circuits, by means of NAND or NOR gates.

FIG. 1 illustrates a conventional implementation of a decoder constituted by NOR gates, whereas FIG. 2 illustrates an equivalent implementation using NAND gates.

With reference to FIG. 1, the decoder is composed of four NOR gates 1a–d, to the inputs whereof two signals A1 and A2 are applied in various combinations of inverting and non-inverting inputs. The signals A1x and A2x are present at the input of the first NOR gate 1a. The designation with the letter "x" indicates that the input of the gate is not inverted, whereas the designation with the letter "N" indicates that the input of the gate is inverted. Accordingly, the inputs A1 and A2 and the respective outputs of the NOR gates 1a–d can be represented by the following table:

TABLE 1

| A2 | A1 | NOR | Output | Code |
|---|---|---|---|---|
| 0 | 0 | 1a | Y0 | CODE0 |
| 0 | 1 | 1b | Y1 | CODE1 |
| 1 | 0 | 1c | Y2 | CODE2 |
| 1 | 1 | 1d | Y3 | CODE3 |

Each combination of the two input bits A1 and A2 activates a single output line of a single NOR gate.

The equivalent circuit provided by means of NAND gates is shown in FIG. 2, where the NAND gates are indicated by the numerals 2a–d.

FIGS. 3 and 4 respectively illustrate the hardware embodiments of the decoders of FIGS. 1 and 2. With reference to FIG. 3, each NOR gate 1a–d is implemented in the same manner and is composed of four transistors T1–T4.

The transistors T1 and T2 are of the P-channel type, are series-connected, and are interposed between a reference voltage $V_{DD}$ and the output Y. The gates of the transistors T1 and T2 are connected to the inputs A1 and A2 respectively. The transistors T3 and T4, of the N-channel type, are parallel-connected and are interposed between a ground path GND and the output Y of the NOR gate. The operation of the NOR gates 1a–d can be easily deduced. If the inputs A1x and A2x are at level 0, the transistors T1 and T2 are switched on and the output Y is brought to the level $V_{DD}$, i.e., logic level 1. If instead both inputs A1x and A2x are brought to level 1, the transistors T3 and T4 are switched on and the output Y is brought to the GND level, i.e., to logic level 0. If the inputs A1x and A2x are different, at least one of the transistors T1 or T2 will be switched off, whereas at least one of the transistors T3 or T4 will be switched on, again bringing the output to logic level 0. The remaining gates 1b–d will have different inputs (inverted or not inverted) depending on their decoding combination.

On the other hand, in the NAND embodiment, and with reference to FIG. 4, the inputs A1 and A2 are respectively connected to the gates of two transistors T5 and T6 of the P-channel type, which are parallel-connected and are interposed between a reference voltage $V_{DD}$ and the output Y. The inputs A1 and A2 are furthermore respectively connected to the gates of two other transistors T7 and T8 of the N-channel type which are series-connected and interposed between the ground path GND and the output Y. The operation of the NAND gates 2a–d can be easily deduced from the operation of the NOR gates.

Such embodiments can be extended to decoders with three or more inputs and with multiple outputs. The main drawback of such decoders is the large number of transistors used, which corresponds to the number of decoding lines, and this entails a bulky device which has a high capacitive load.

SUMMARY OF THE INVENTION

An object of the present invention is to provide an improved decoder.

In accordance with one illustrative embodiment of the invention, a reduced architecture decoder is provided to decode a plurality of input signals that include a least significant input signal. The decoder comprises at least one pair of adjacent logic gates, each of the at least one pair of logic gates receiving at least one logic input signal that is selected from a group of logic signals that include the input signals to the decoder and the inverse of the input signals to the decoder. The logic input signals received by the at least one pair of adjacent logic gates are common to both adjacent logic gates of the pair, except for those logic signals representing the least significant decoder input signal and the inverse of the least significant decoder signal.

In another illustrative embodiment of the invention, a decoding circuit is provided within an N-bit binary decoder. The N-bit binary decoder receives N decoder signals and produces an inverse of each of the N decoder signals so that the N decoder signals and the inverse of the N decoder signals form 2N logic signals. The N-bit binary decoder asserts one of $2^N$ decoder output signals based upon a value of the N decoder signals. The decoding circuit within the N-bit binary decoder comprises a first logic gate that receives at least two of the 2N logic signals and asserts a first of the $2^N$ decoder output signals when the N decoder signals have a first value, a second logic gate that receives at least two of the 2N logic signals and asserts a second of the $2^N$ decoder output signals when the N decoder signals have a second value, and the first and second logic gates share at least one shared transistor.

In another illustrative embodiment of the invention, a decoding circuit is provided within an N-bit binary decoder. The N-bit binary decoder receives N decoder signals, produces an inverse of each of the N decoder signals so that the N decoder signals and the inverse of the N decoder signals form 2N logic signals, and asserts one of $2^N$ decoder output signals based upon a value of the N decoder signals. The decoding circuit within the N-bit binary decoder comprises a first set of transistors that is arranged to receive at least two of the 2N logic signals and assert a first of the $2^N$ decoder output signals when the N decoder signals have a first value, and a second set of transistors that is arranged to receive at least two of the 2N logic signals and assert a second of the $2^N$ decoder output signals when the N decoder signals have a second value. In addition, the first set of transistors and the second set of transistors share at least one shared transistor.

In a further illustrative embodiment of the invention, a method of forming an N-bit binary decoder that receives N decoder signals and asserts one of $2^N$ decoder output signals based upon a value of the N decoder signals is provided. The method includes providing $2^N$ logic gates that each assert one of the $2^N$ decoder output signals when the N decoder signals have a predetermined value, the $2^N$ logic gates including at least a first logic gate and a second logic gate. The method includes sharing at least one shared transistor between the first logic gate and the second logic gate.

In a further illustrative embodiment of the invention, a method of forming a decoder circuit, within an N-bit binary decoder, that receives N decoder signals, produces an inverse of each of the N decoder signals so that the N decoder signals and the inverse of the N decoder signals form 2N logic signals, and asserts one of $2^N$ decoder output signals based upon a value of the N decoder signals is provided. The method of forming the decoder circuit includes arranging a first set of transistors to receive at least two of the 2N logic signals and to assert a first of the $2^N$ decoder output signals when the N decoder signals have a first value, arranging a second set of transistors to receive at least two of the 2N logic signals and to assert a second of the $2^N$ decoder output signals when the N decoder signals have a second value, and sharing at least one transistor between the first set of transistors and the second set of transistors.

In another illustrative embodiment of the invention, a decoding circuit is provided within an N-bit binary decoder. The N-bit binary decoder receives N decoder signals, produces an inverse of each of the N decoder signals so that the N decoder signals and the inverse of the N decoder signals form 2N logic signals, and asserts one of $2^N$ decoder output signals based upon a value of the N decoder signals. The decoding circuit within the N-bit binary decoder comprises a first logic gate that receives at least two of the 2N logic signals and asserts a first of the $2^N$ decoder output signals when the N decoder signals have a first value, a second logic gate that receives at least two of the 2N logic signals and asserts a second of the $2^N$ decoder output signals when the N decoder signals have a second value, and a means for sharing at least one shared transistor between the first and second logic gates.

In yet another illustrative embodiment of the invention, an N-bit binary decoder is provided that receives N decoder signals including a least significant decoder signal, and asserts one of $2^N$ decoder output signals based upon a value of the N decoder signals. The decoder comprises N input terminals for respectively receiving the N decoder signals, $2^N$ decoder output terminals that each respectively outputs one of the $2^N$ decoder output signals, and N inverters. Each of the N inverters is coupled to one of the N input terminals that receive a respective one of the N decoder signals, and produces a corresponding inverse signal of the respective one of the N decoder signals to generate N inverse signals so that the N decoder signals and the N inverse signals form a set of 2N logic signals. The N bit decoder further comprises $2^N$ sets of transistors, each of the $2^N$ sets of transistors that receives N logic signals from the set of 2N logic signals, each of the $2^N$ sets of transistors being coupled to one of the $2^N$ decoder output terminals and asserting one of the $2^N$ decoder output signals when the N decoder signals have a predetermined value. The $2^N$ sets of transistors include at least a first and a second sets of transistors, the first and second sets of transistors sharing at least one shared transistor.

BRIEF DESCRIPTION OF THE DRAWINGS

The characteristics and advantages of the invention will become apparent from the description of illustrative embodiments shown by way of example in the accompanying drawings, in which:

FIG. 5 is a schematic view of a binary decoder with two inputs according to the present invention, provided by means of NOR gates;

FIG. 6 is a schematic view of a binary decoder with two inputs according to the present invention, provided by means of NAND gates;

FIG. 7 is a view of a hardware embodiment of a component block of a binary decoder with two inputs according to the present invention, provided by means of NOR gates;

DETAILED DESCRIPTION

Figure 1:
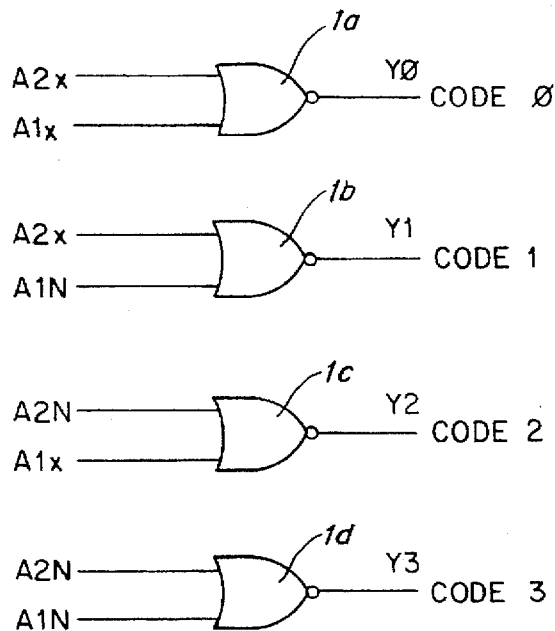
FIG. 1 is a schematic view of a known binary decoder with two inputs, provided by using NOR gates.
Figure 2:
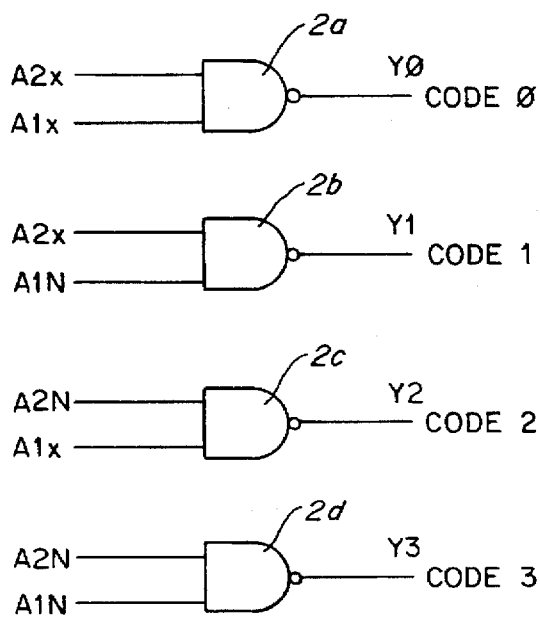
FIG. 2 is a schematic view of a known binary decoder with two inputs, provided by means of NAND gates.
Figure 3:
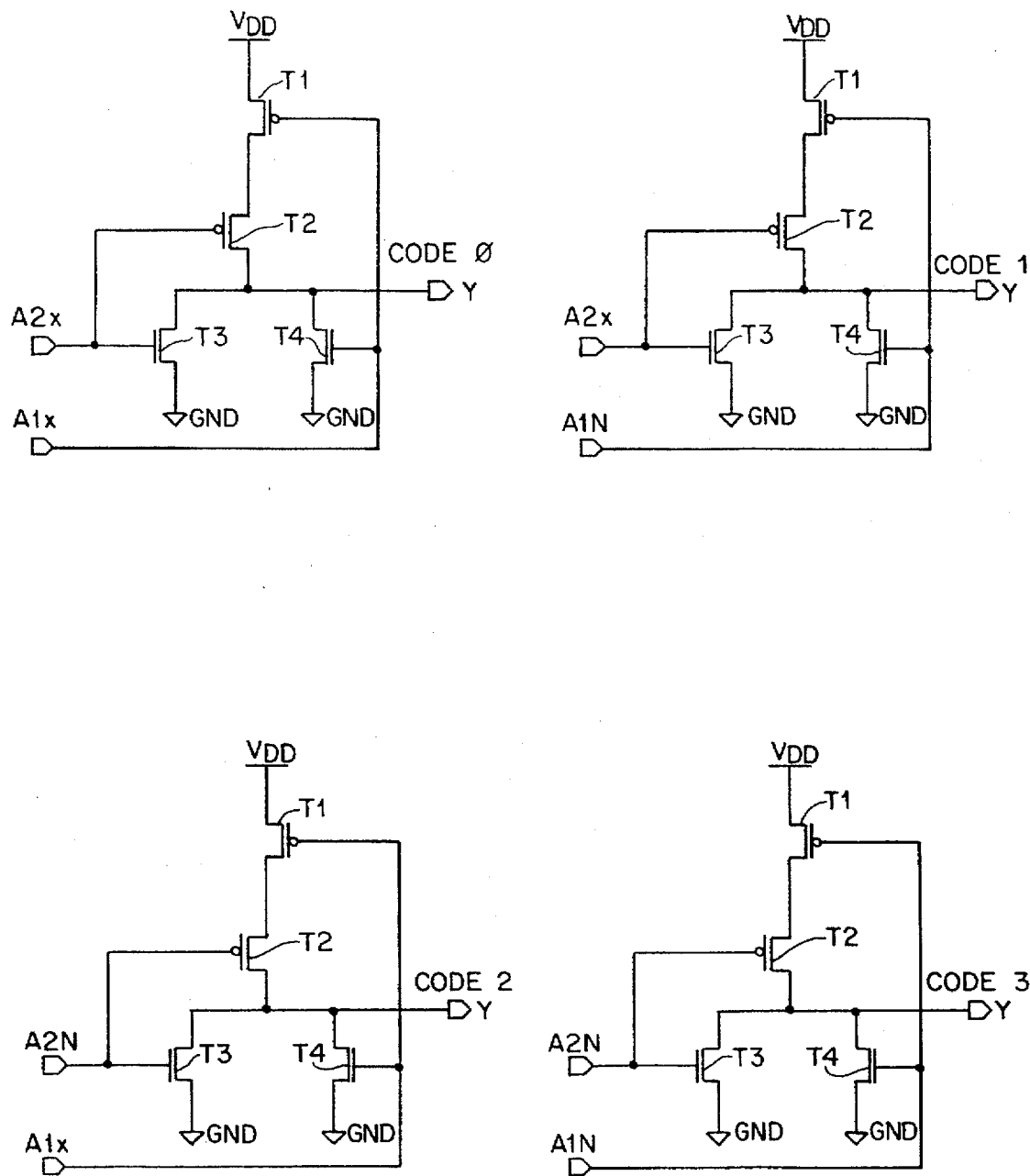
FIG. 3 is a view of the hardware embodiment of the decoder of FIG. 1.

With reference to the circuit of FIG. 1, it is noted that two adjacent gates have a signal in common, namely the signal A2x for gates 1a and 1b and the signal A2N for gates 1c and 1d. In this manner it is possible to achieve the embodiment of the circuit according to the present invention which is shown in FIG. 5. Said Figure shows that gates 1a and 1b have an input A2x in common, whereas the inputs related to the least significant bits A1x and A1N are still divided, each one being applied to a corresponding gate. Likewise, there is a common input signal A2N for gates 1c and 1d as well, whereas the signals related to the least significant bits A1x and A1N are applied to their respective gates as before.

The situation is similar in the NAND embodiment of FIG. 6. The gates 2a and 2d receive a common signal A2x as input, whereas the signals related to the least significant bits A1x and A1N are sent to the respective gates 2a and 2b. The gates 2c and 2d instead receive a common signal A2N as input, whereas the signals related to the least significant bits A1x and A1N are sent to their respective gates 2c and 2d. Having an input signal between two adjacent gates entails a significant change in the ports at the hardware level.

Figure 7A:
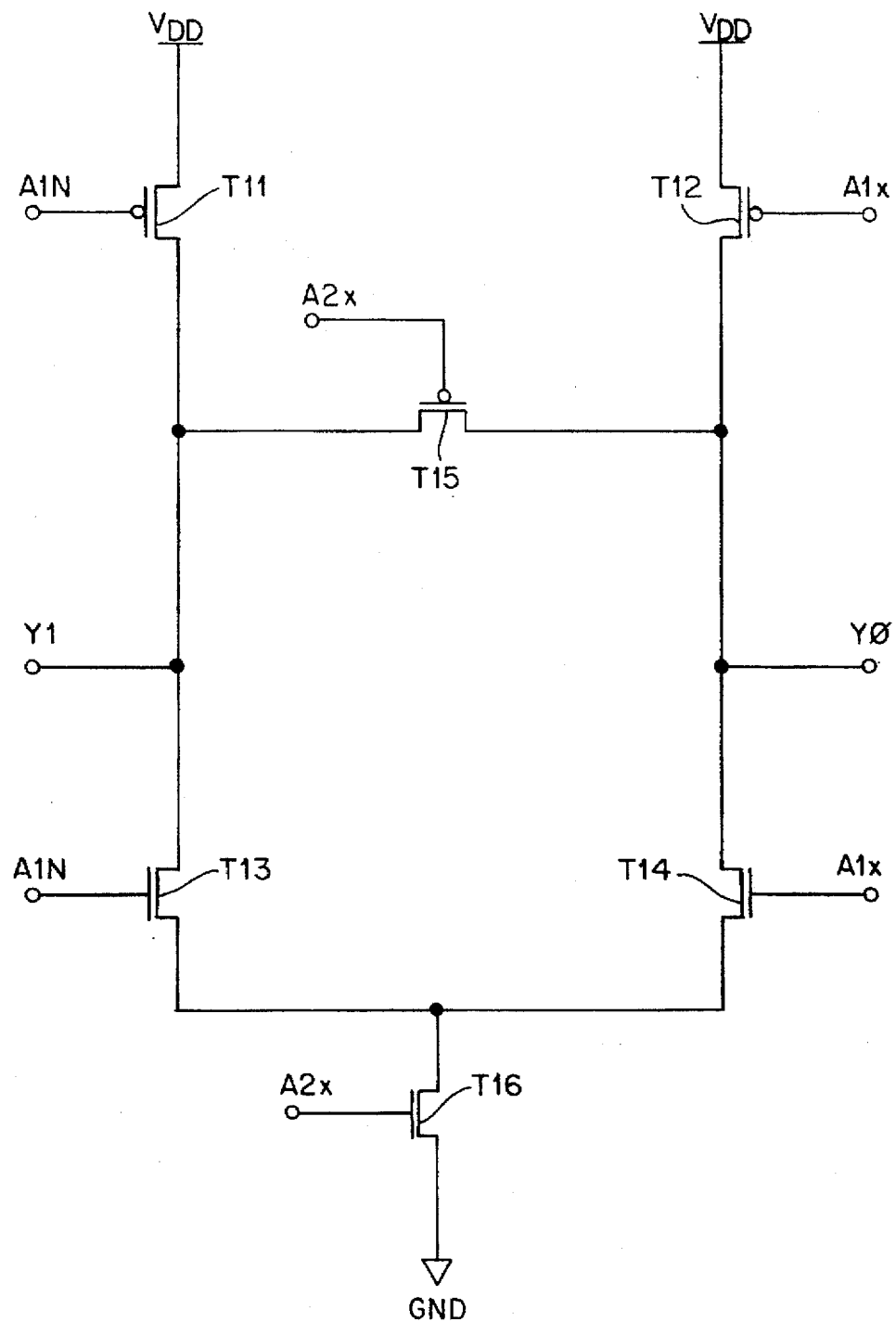
FIG. 7a is a view of a hardware embodiment of a component block of a binary decoder with two inputs according to the present invention, provided by means of NAND gates.

FIG. 7a illustrates a component block for a binary decoder with two inputs that corresponds to a pair of NAND gates which have a common input signal, such as for example the gates 2a and 2b. For these two NAND gates 2a and 2b there are three input signals: A1x, A1N, and the common signal A2x. The first signal A1x is applied to a P-channel transistor T12 which connects the output Y0 of the first NAND 2a to a reference voltage $V_{DD}$. The same signal is applied to a N-channel transistor T14 that connects the output Y0, across a second N-channel transistor T16, to the ground path GND. The common signal A2x is applied to the second N-channel transistor T16.

Like the first signal A1x, the second signal A1N is applied to a second P-channel transistor T11 that connects the second output Y1 to the reference voltage $V_{DD}$. The same signal is applied to a N-channel transistor T13 that connects the output Y1, across the second N-channel transistor T16, to ground path GND. There is also a P-channel transistor T15 to which the common signal A2x is applied; said transistor T15 also connects the first output Y0 to the second output Y1.

Figure 4:
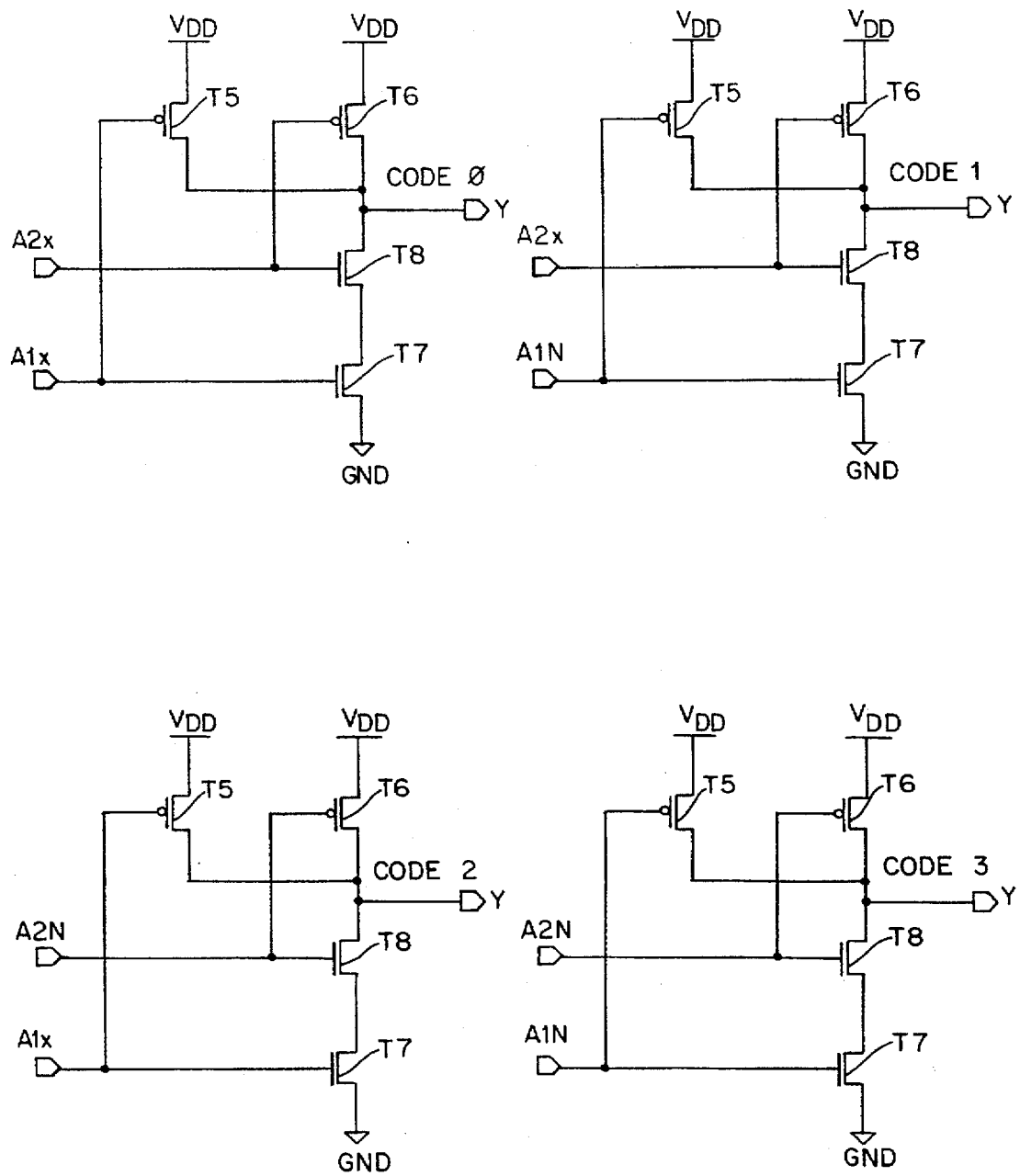
FIG. 4 is a view of the hardware embodiment of the decoder of FIG. 2.

The above described circuit is equivalent to two adjacent NAND circuits of FIG. 4. It can be observed that only six transistors, instead of eight, are required in the embodiment according to the present invention.

FIG. 7 instead shows the hardware embodiment of two adjacent NOR gates 1a and 1b having an input A2x in common. Said input is applied to a P-channel transistor T17 that connects the inputs Y1 and Y0 to the reference voltage $V_{DD}$ respectively by means of a second P-channel transistor T18 and a third P-channel transistor T19. The signal A1x is applied to the second P-channel transistor T18 and the signal A1N is applied to the third P-channel transistor T19.

The outputs Y0 and Y1 are furthermore connected to the ground GND respectively by means of a first N-channel transistor T20 and a second N-channel transistor T21. Finally, the common signal A2x is sent to a third N-channel transistor that connects the outputs Y0 and Y1.

Figure 8:
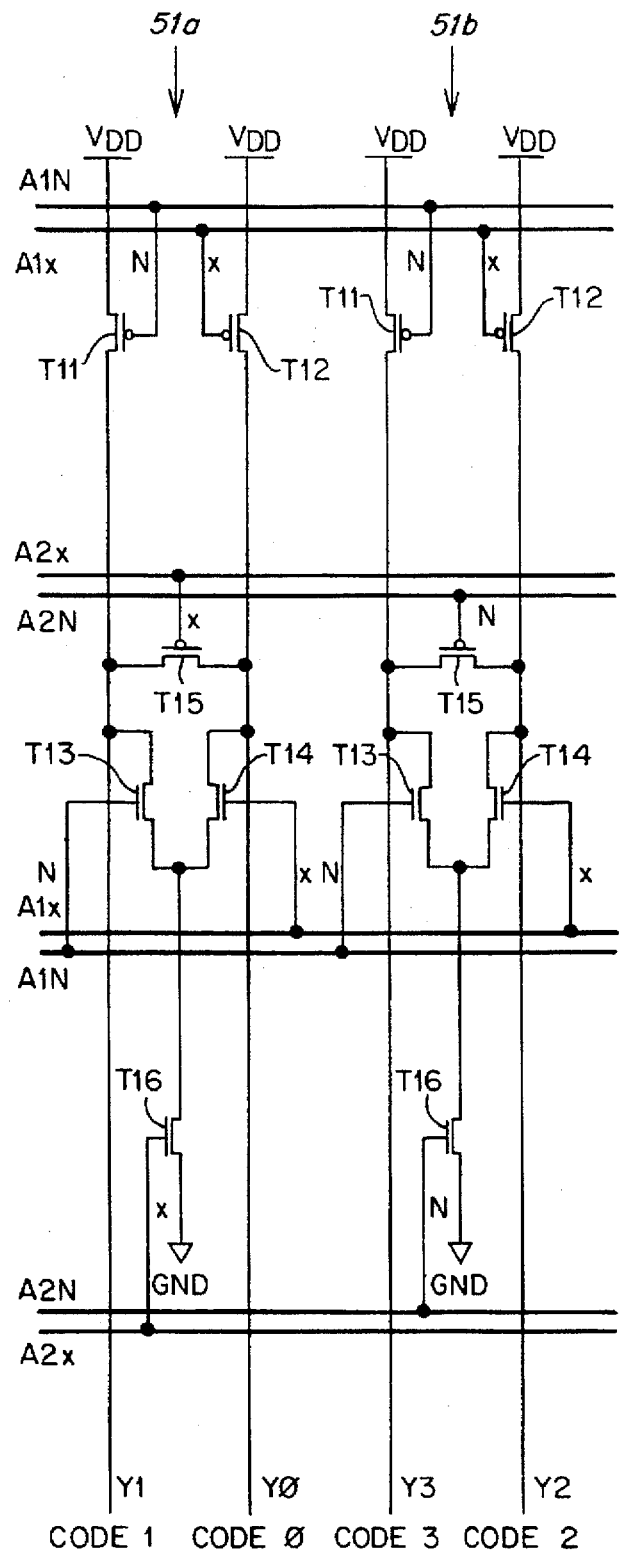
FIG. 8 is a view of an embodiment of a binary decoder with two inputs according to the present invention, provided by means of NAND gates.
Figure 9:
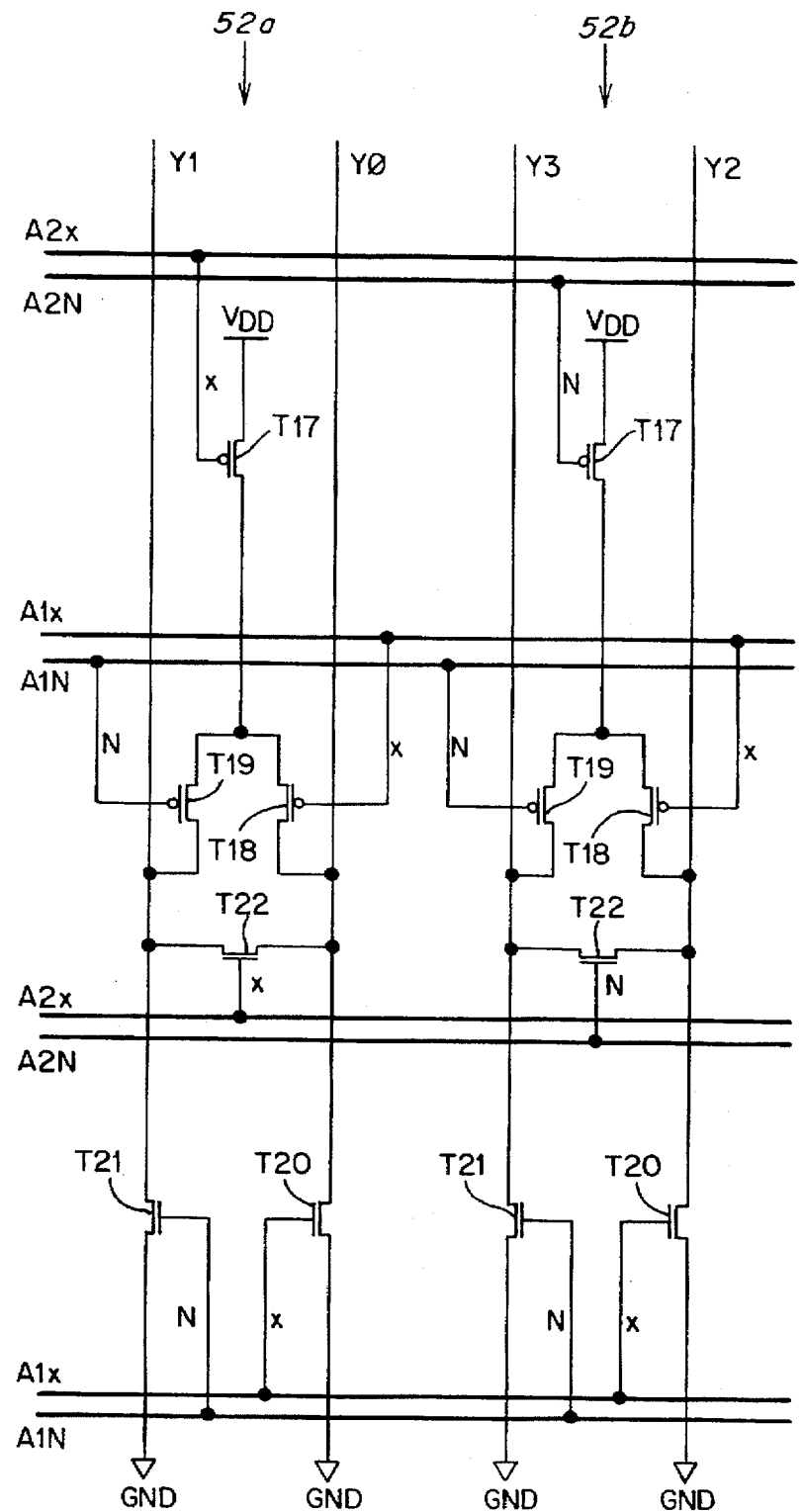
FIG. 9 is a view of an embodiment of a binary decoder with two inputs according to the present invention, provided by means of NOR gates.

The circuits of FIGS. 7a and 7 are used to form the binary decoders with two inputs shown in FIG. 8 (NAND version) and in FIG. 9 (NOR version).

FIG. 8 illustrates two component blocks 51a and 51b; 51a is identical to FIG. 7a, and 51b is symmetrical to FIG. 7a. The two blocks are mutually connected to form the four outputs Y0–Y3 that generate the four codes CODE0–CODE3 given by table 1.

Similary, in FIG. 9, the two component blocks are designated by the reference numerals 52a and 52b. Each one of the blocks 52a and 52b comprises two respective outputs indicated by Y0 and Y1 for the block 52a and by Y2 and Y3 for the block 52b.

It should be recognized that for the NAND embodiment (FIG. 8) the inputs related to the common signals, for instance, the signal A2x in block 51a, always activate an N-channel transistor T16 which is series-connected to the ground path GND, and a P-channel transistor T15 which is series-connected to the outputs Y0 and Y1 (or Y2 and Y3). The signals related to the least significant bits (A1x and A1N) instead always activate a pair of P-channel transistors T11 and T12 that connect the outputs to the reference voltage $V_{DD}$ and another pair of N-channel transistors T13 and T14 that connects the outputs to the transistor T16.

The part of the circuit that is related to the common signals is commonly known as an OR part, and it is noted that for adjacent NAND gates, all the signals, except for the least significant bits, can be provided by means of a common OR part. The part of the circuit which is related to the least significant bits instead provides alternation of the supply lines.

In the NOR embodiment of FIG. 9, the common signal A2x activates a P-channel transistor T17 which is series-connected to the reference voltage $V_{DD}$ and a N-channel transistor T22 that connects the outputs of Y0 and Y1 (or Y2 and Y3). Said transistors T17 and T22 constitute the OR part of the circuit. The signals related to the least significant bits (A1x and A1N) always activate a pair of N-channel transistors T20 and T21 that connect the outputs to the ground path GND and another pair of P-channel transistors T18 and T19 that connect the outputs to the transistor T17. The transistors T18–T21 alternate the supply lines.

Figure 10:
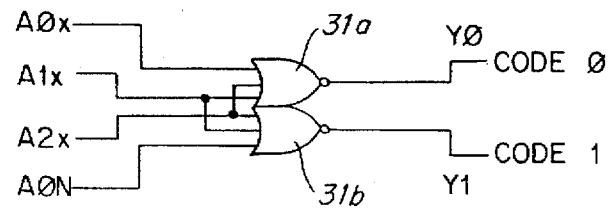
FIG. 10 is a schematic view of a binary decoder with three inputs according to the present invention, provided by means of NOR gates.
Figure 10:
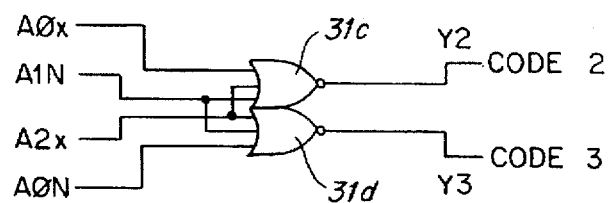
Figure 10:
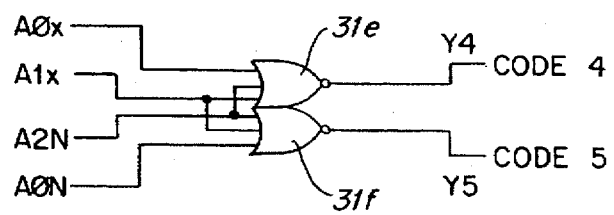
Figure 10:
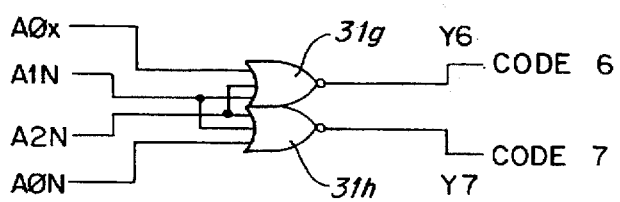

The present invention can also be applied to decoder configurations having more inputs. FIG. 10 illustrates the configuration of a NOR decoder with three inputs A0, A1, and A2. The common signals of the first pair of adjacent NOR gates 31a and 31b are A1x and A2x, whereas the signals related to the least significant bits A0x and A0N are sent to the respective gates 31a and 31b. A similar concept is also applied to the remaining three pairs of NOR gates 31c–31d, 31e–31f, and 31g–31h.

Figure 11:
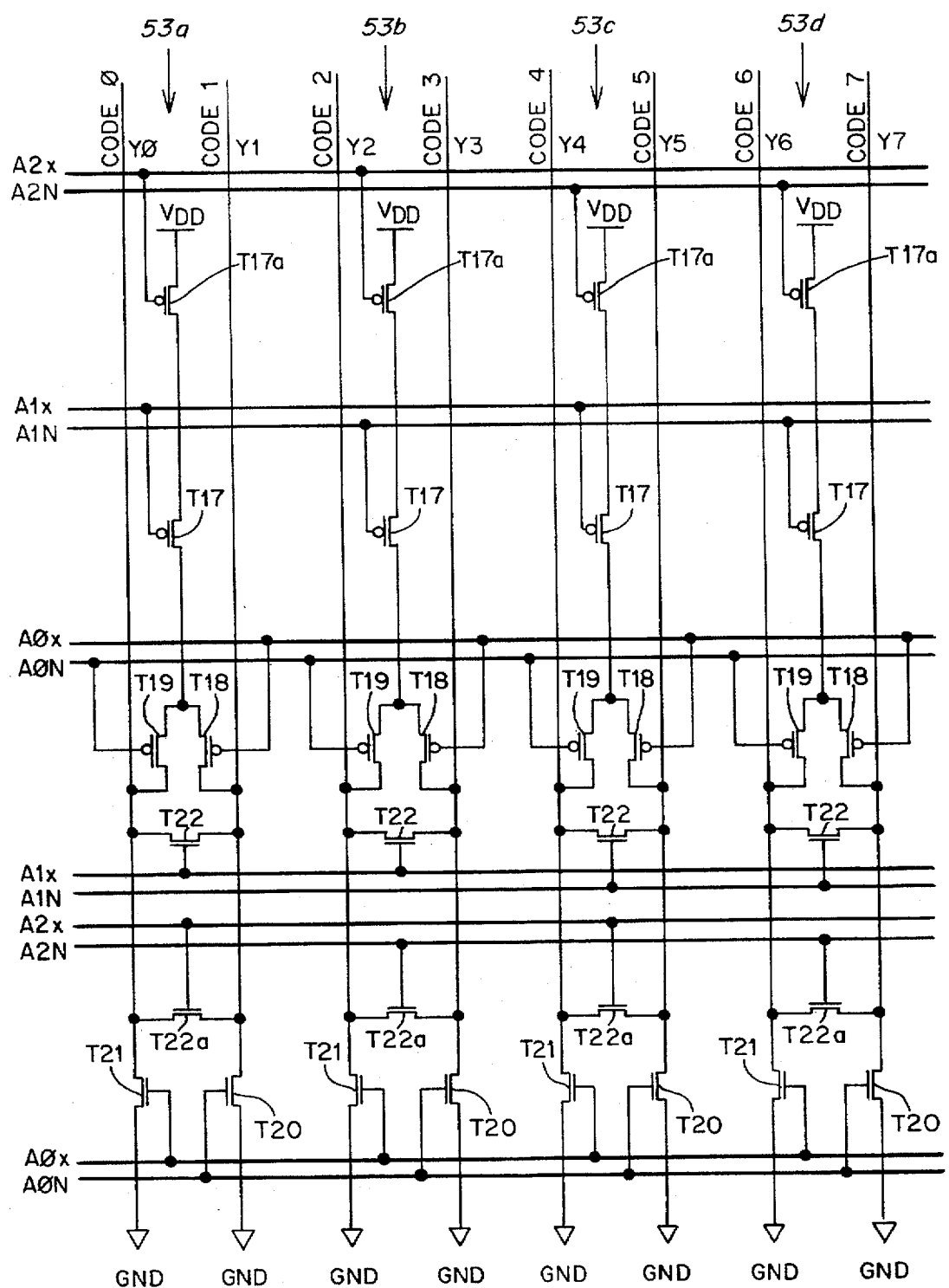
FIG. 11 is a view of a hardware embodiment of the binary decoder with three inputs of FIG. 10.

The hardware embodiment of this configuration is shown in FIG. 11. The transistors that correspond to the two input configuration are designated by the same reference numerals, whereas the additional transistors are designated by the suffix "a". The Figure shows that there are four component blocks 53a–d that correspond to four pairs of NOR gates. The component block is essentially identical to the one of the two-input version, except that the OR part is larger. It is in fact evident that there an additional P-channel transistor T17a which is series-connected to the reference voltage $V_{DD}$ and receives the second common signal A2x in input, whereas the first common signal is sent to the transistor T17. Likewise, there is an additional N-channel transistor that connects the two outputs Y0 and Y1 (or the other pairs of outputs) and is driven by the same second common signal. The part related to the least significant signals A0x and A0N is identical to the one in the two-input configuration.

A method according to the present invention allows a significant reduction in the number of transistors, resulting in a reduction in capacitive load. The space occupation of the device is also reduced and the circuit features good modularity. The decoder according to the present invention furthermore has a compact layout, since the logic gates can be easily formed below the buses of the decoding lines.

The invention thus conceived is susceptible of numerous modifications and variations, all of which are within the scope of the inventive concept.

Thus, for example, it is possible to provide decoders with a greater number of inputs starting from those described herein. The described method is furthermore not an exclusive prerogative of decoders in which the inputs have purely binary characteristics (i.e. address line and complement thereof), but is also suitable for lines that have already been pre-decoded with prevailing output configurations both in the 0 field and in the 1 field. For such situations, one pre-decoder (the least significant one) is used to select the supply line ($V_{DD}$ for the NAND configuration and GND for the NOR configuration), while the other ones are OR-connected between two adjacent outputs and combined in an orderly fashion to produce the entire number of possible combinations. The decoded line will belong to the set that forms the largest number of isolations of the alternating supply line.

It should be understood that all the details described above may be replaced with other technically equivalent ones. In practice, the materials employed, as well as the shapes and dimensions, may be any according to the teaching provided above.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A reduced architecture decoder for decoding a plurality of decoder input signals including a least significant decoder input signal, the decoder comprising:
   a first reference voltage terminal;
   a second reference voltage terminal; and
   a component block that includes a first logic gate and a second logic gate, the first and second logic gates receiving a plurality of logic input signals, each logic input signal representing a signal selected from a group including the plurality of decoder input signals and an inverse of each of the plurality of decoder input signals, the plurality of logic input signals received by the first and second logic gates being common to both the first and second logic gates except for logic input signals representing the least significant decoder input signal and the inverse of the least significant decoder input signal, the component block including:
   a first output terminal;
   a second output terminal;
   a common node;
   a plurality of series-connected transistors connected between the first reference voltage terminal and the common node, each of the plurality of series-connected transistors being activated by a respective one of the plurality of common logic input signals;
   a plurality of parallel-connected transistors coupled between the first output terminal and the second output terminal, each of the plurality of parallel-connected transistors being activated by a respective one of the plurality of common logic signals;
   a first transistor connected between the common node and the first output terminal, the first transistor being activated by the least significant decoder input signal;
   a second transistor connected between the common node and the second output terminal, the second transistor being activated by the inverse of the least significant decoder input signal;
   a third transistor connected between the first output terminal and the second reference voltage terminal, the third transistor being activated by the least significant decoder input signal; and
   a fourth transistor connected between the second output terminal and the second reference voltage terminal, the fourth transistor being activated by the inverse of the least significant decoder input signal.

2. The reduced architecture decoder of claim 1, wherein the first and second logic gates are NOR gates.

3. The reduced architecture decoder of claim 1, wherein the first and second logic gates are NAND gates.

4. The reduced architecture decoder according to claim 2, wherein the first and second transistors and the plurality of series-connected transistors are P-channel transistors, and the third and fourth transistors and the plurality of parallel-connected transistors are N-channel transistors.

5. The reduced architecture decoder according to claim 3, wherein the first and second transistors and the plurality of series-connected transistors are N-channel transistors, and the third and fourth transistors and the plurality of parallel-connected transistors are P-channel transistors.

6. In an N-bit binary decoder for receiving N decoder signals, producing an inverse of each of the N decoder signals so that the N decoder signals and the inverse of the N decoder signals form 2N logic signals, and asserting one of $2^N$ decoder output signals based upon a value of the N decoder signals, a decoding circuit comprising:
   a first reference voltage terminal;
   a first logic gate that receives a first plurality of the 2N logic signals and asserts a first of the $2^N$ decoder output signals when the N decoder signals have a first value, the first plurality of the 2N logic signals including a first logic signal and plurality of common logic signals, the first logic gate including a plurality of input terminals, a common node, and a plurality of series-connected transistors connected between the common node and the first reference voltage terminal, each of the plurality of series-connected transistors including a control terminal, the plurality of input terminals including a first input terminal that receives the first logic signal and a plurality of second input terminals that each receives a respective one of the plurality of common logic signals, each of the plurality of second input terminals being coupled to the control terminal of a respective one of the plurality of series-connected transistors; and
   a second logic gate that receives a second plurality of the 2N logic signals and asserts a second of the $2^N$ decoder output signals when the N decoder signals have a second value, the second plurality of the 2N logic signals including an inverse of the first logic signal and the plurality of common logic signals, the second logic gate including a plurality of input terminals, the plurality of input terminals of the second logic gate including a first input terminal that receives the inverse of the first logic signal and a plurality of second input terminals that each receives a respective one of the plurality of common logic signals, the second logic gate further including the common node and the plurality of series-connected transistors connected between the first reference voltage terminal and the common node, such that the plurality of series-connected transistors and the common node is shared between the first and second logic gates.

7. The decoding circuit of claim 6, wherein the first and second logic gates each includes output terminals that respectively output the first of the $2^N$ decoder output signals and the second of the $2^N$ decoder output signals, and wherein:
   the first logic gate further includes a first output transistor, a plurality of parallel-connected transistors, and a plurality of third input terminals that each receives a respective one of the plurality of common logic signals, the first output transistor being coupled between the common node and the output terminal of the first logic gate and having a control terminal that is coupled to the first input terminal of the first logic gate, the plurality of parallel-connected transistors being coupled between the output terminal of the first logic gate and the output terminal of the second logic gate, and each of the plurality of parallel-connected transistors having a control terminal that is coupled to a respective one of the plurality of third input terminals; and
   the second logic gate further includes a first output transistor and a plurality of third input terminals that each receives a respective one of the plurality of common logic signals, the first output transistor of the second logic gate being coupled between the common node and the output terminal of the second logic gate and having a control terminal that is coupled to the first input terminal of the second logic gate, the second logic gate including the plurality of parallel-connected transistors, such that the plurality of parallel-connected transistors is shared between the first and second logic gates.

8. The decoding circuit of claim 7, wherein a number of transistors that are shared between the first and second logic gates is equal to twice a number of the plurality of common logic signals received by the first and second logic gates.

9. The decoding circuit of claim 7, further comprising a second reference voltage terminal, wherein:
the first logic gate further includes a second output transistor having a control terminal that is coupled to the first terminal of the first logic gate; and
the second logic gate further includes a second output transistor having a control terminal that is coupled to the first terminal of the second logic gate.

10. The decoding circuit of claim 9, wherein the output terminal of the first logic gate is electrically coupled to the first reference voltage terminal when the first of the $2^N$ decoder output signals is asserted and is electrically coupled to the second reference voltage terminal when the first of the $2^N$ decoder output signals is de-asserted; and
wherein the output terminal of the second logic gate is electrically coupled to the first reference voltage terminal when the second of the $2^N$ output signals is asserted and is electrically coupled to the second reference voltage terminal when the second of the $2^N$ output signals is de-asserted.

11. The decoding circuit of claim 7, wherein the plurality of series-connected transistors are N-channel transistors, and the plurality of parallel-connected transistors are P-channel transistors.

12. The decoding circuit of claim 7, wherein the plurality of series-connected transistors are P-channel transistors, and the plurality of parallel-connected transistors are N-channel transistors.

13. An N-bit binary decoder to receive N decoder signals and assert one of $2^N$ decoder output signals based upon a value of the N decoder signals, the decoder comprising:
a first decoder output terminal and a second decoder output terminal that respectively output a first of the $2^N$ decoder output signals and a second of the 2N decoder output signals;
a first reference voltage terminal and a second reference voltage terminal;
a first series-connected group of at least two transistors connected between the second reference voltage terminal and a connection point;
a second parallel-connected group of at least two transistors connected in parallel between the first decoder output terminal and the second decoder output terminal;
a first branch of transistors connected in series between the first reference voltage terminal and the connection point, the first branch being coupled to the first decoder output terminal; and
a second branch of transistors connected in series between the first reference voltage terminal and the connection point, the second branch being connected in parallel with the first branch and being coupled to the second decoder output terminal.

14. The decoding circuit of claim 13, wherein each of the first and second branches of transistors further includes an N-channel transistor and a P-channel transistor; and
wherein the first decoder output terminal is connected between the N-channel transistor and the P-channel transistor of the first branch of transistors, and the second decoder output terminal is connected between the N-channel transistor and the P-channel transistor of the second branch of transistors.

15. The decoding circuit of claim 14, wherein the first decoder output terminal is electrically coupled to the second reference voltage terminal when the first of the $2^N$ output signals is asserted and is electrically coupled to the first reference voltage terminal when the first of the $2^N$ output signals is de-asserted; and
wherein the second decoder output terminal is electrically coupled to the second reference voltage terminal when the second of the $2^N$ decoder output signals is asserted and is electrically coupled to the first reference voltage terminal when the second of the $2^N$ decoder output signals is de-asserted.

16. A logic circuit comprising:
a first voltage reference terminal;
a first logic gate having a plurality of input terminals, a common node, and a plurality of series-connected transistors coupled to the common node, each of the plurality of series-connected transistors including a control terminal, the plurality of input terminals including a first input terminal that receives a first logic signal and a plurality of second input terminals that each receives a respective one of a plurality of common logic signals, each of the plurality of second input terminals being coupled to the control terminal of a respective one of the plurality of series-connected transistors, the plurality of series-connected transistors being coupled between the first reference voltage terminal and the common node; and
a second logic gate having a plurality of input terminals, the plurality of input terminals of the second logic gate including a first input terminal that receives an inverse of the first logic signal and a plurality of second input terminals that each receives a respective one of the plurality of common logic signals, the second logic gate further including the common node and the plurality of series-connected transistors coupled between the first reference voltage terminal and the common node, such that the plurality of series-connected transistors and the common node are shared between the first and second logic gates.

17. The logic circuit of claim 16, wherein the first and second logic gates are NOR gates.

18. The logic circuit of claim 16, wherein the first and second logic gates are NAND gates.

19. The logic circuit of claim 16, further comprising:
a third logic gate having a plurality of input terminals, a common node, and a plurality of series-connected transistors coupled to the common node of the third logic gate, each of the plurality of series-connected transistors of the third logic gate including a control terminal, the plurality of input terminals of the third logic gate including a first input terminal that receives the first logic signal and a plurality of second input terminals that each receives a respective one of the plurality of common logic signals, each of the plurality of second input terminals of the third logic gate being respectively coupled to the control terminal of a respective one of the plurality of series-connected transistors of the third logic gate, the plurality of series-connected transistors of the third logic gate being coupled between the first reference voltage terminal and the common node of the third logic gate;

a fourth logic gate having a plurality of input terminals, the plurality of input terminals of the fourth logic gate including a first input terminal that receives an inverse of the first logic signal and a plurality of second input terminals that each receives a respective one of the plurality of common logic signals, the fourth logic gate further including the common node of the third logic gate and the plurality of series-connected transistors of the third logic gate that are coupled between the first reference voltage terminal and the common node of the third logic gate, such that the plurality of series-connected transistors of the third logic gate and the common node of the third logic gate are shared between the third and fourth logic gates.

20. The logic circuit of claim 19, wherein the first, second, third, and fourth logic gates are NOR gates.

21. The logic circuit of claim 19, wherein the first, second, third, and fourth logic gates are NAND gates.

22. A logic circuit to receive a plurality of input signals and assert a first output signal when the plurality of input signals has a first value and assert a second output signal when the plurality of input signals has a second value, the logic circuit comprising:

a first output terminal on which the first output signal is asserted;

a second output terminal on which the second output signal is asserted;

a first reference voltage terminal;

a second reference voltage terminal;

a common connection point;

a first transistor coupled between the common connection point and the first output terminal, the first transistor having a control terminal that receives a first of the plurality of input signals;

a second transistor coupled between the first output terminal and the first reference voltage terminal, the second transistor having a control terminal that receives the first of the plurality of input signals;

a third transistor coupled between the common connection point and the second output terminal, the third transistor having a control terminal that receives an inverse of the first of the plurality of input signals;

a fourth transistor coupled between the second output terminal and the first reference voltage terminal, the fourth transistor having a control terminal that receives the inverse of the first of the plurality of input signals;

a plurality of parallel transistors coupled in parallel between the first output terminal and the second output terminal, each of the plurality of parallel transistors having a control terminal that receives a respective one of the plurality of input signals; and a plurality of series transistors coupled in series between the common connection point and the second reference voltage terminal, each of the plurality of series transistors having a control terminal that receives a respective one of the plurality of input signals.

23. The logic circuit of claim 22, wherein each of the plurality of series transistors receives a respective one of the plurality of input signals other than the first input signal and the inverse of the first input signal.

24. A logic circuit comprising:

a first logic gate;

a second logic gate coupled to the first logic gate, the second logic gate sharing a first plurality of shared transistors with the first logic gate;

a third logic gate; and a fourth logic gate coupled to the third logic gate, the fourth logic gate sharing a second plurality of shared transistors with the third logic gate, the second plurality of shared transistors being distinct from the first plurality of shared transistors, so that the first and second logic gates are independent of the third and fourth logic gates.

25. The logic circuit of claim 24, wherein the first, second, third, and fourth logic gates are NOR gates.

26. The logic circuit of claim 24, wherein the first, second, third, and fourth logic gates are NAND gates.

* * * * *